(12) United States Patent
Ryoo et al.

(10) Patent No.: US 8,193,047 B2
(45) Date of Patent: Jun. 5, 2012

(54) SEMICONDUCTOR DEVICE HAVING SUFFICIENT PROCESS MARGIN AND METHOD OF FORMING SAME

(75) Inventors: Man-Hyoung Ryoo, Gyeonggi-do (KR); Gi-Sung Yeo, Seoul (KR); Si-Hyeung Lee, Gyeonggi-do (KR); Gyu-Chul Kim, Gyeonggi-do (KR); Sung-Gon Jung, Seoul (KR); Chang-Min Park, Seoul (KR); Hoo-Sung Cho, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/654,798

(22) Filed: Jan. 4, 2010

(65) Prior Publication Data

US 2010/0190303 A1  Jul. 29, 2010

Related U.S. Application Data

(60) Continuation of application No. 11/737,675, filed on Apr. 19, 2007, now abandoned, which is a division of application No. 10/892,588, filed on Jul. 15, 2004, now Pat. No. 7,221,031.

(30) Foreign Application Priority Data

Jul. 15, 2003  (KR) .................................. 2003-48223

(51) Int. Cl.
*H01L 21/8239* (2006.01)

(52) U.S. Cl. .................................. 438/197; 257/E21.645

(58) Field of Classification Search .................. 438/172, 438/197; 257/392, E21.645
See application file for complete search history.

(56) References Cited

U.S. PATENT DOCUMENTS

| 5,747,380 | A  | * | 5/1998  | Yu et al. ........................ 438/599 |
| 6,297,129 | B2 |   | 10/2001 | Tran et al. |
| 6,483,136 | B1 |   | 11/2002 | Yoshida et al. |
| 6,791,200 | B2 |   | 9/2004  | Nii |
| 6,812,534 | B2 | * | 11/2004 | Ishigaki et al. ............... 257/401 |
| 7,057,225 | B2 | * | 6/2006  | Keeth et al. .................. 257/304 |
| 7,221,031 | B2 | * | 5/2007  | Ryoo et al. ................... 257/393 |
| 2004/0043546 | A1 | * | 3/2004 | Yoshida et al. ............... 438/149 |
| 2004/0108512 | A1 | * | 6/2004 | Iwata et al. ................... 257/100 |
| 2004/0110095 | A1 | * | 6/2004 | Imai et al. ..................... 430/311 |
| 2009/0034317 | A1 | * | 2/2009 | Tomita et al. ................. 365/104 |

FOREIGN PATENT DOCUMENTS

| JP | 10-209298     | 8/1998 |
| JP | 2002-26125    | 1/2002 |
| KR | 1999-0074949  | 10/1999 |
| KR | 2001-0010407  | 2/2001 |

* cited by examiner

*Primary Examiner* — William D Coleman
*Assistant Examiner* — Christine Enad
(74) *Attorney, Agent, or Firm* — Harness, Dickey & Pierce

(57) ABSTRACT

According to some embodiments of the invention, a substrate doped with a P type impurity is provided. An N type impurity is doped into the substrate to divide the substrate into a P type impurity region and an N type impurity region. Active patterns having a first pitch are formed in the P type and N type impurity regions. Gate patterns having a second pitch are formed on the active patterns in a direction substantially perpendicular to the active patterns. Other embodiments are described and claimed.

20 Claims, 15 Drawing Sheets

SEMICONDUCTOR DEVICE HAVING SUFFICIENT PROCESS MARGIN AND METHOD OF FORMING SAME

CROSS REFERENCE TO RELATED APPLICATIONS

This application is a continuation of application Ser. No. 11/737,675, filed Apr. 19, 2007, now abandoned, which is a divisional of application Ser. No. 10/892,588 filed Jul. 15, 2004, now U.S. Pat. No. 7,221,031, which claims the benefit under 35 U.S.C. §119(a) of Korean Patent Application No. 2003-48223 filed on Jul. 15, 2003, the contents of each are herein incorporated by reference in their entirety.

BACKGROUND OF THE INVENTION

1. Field of the Invention

The present invention relates to a semiconductor device, a method of manufacturing a semiconductor device, an SRAM device and a method of manufacturing an SRAM device. More particularly, the present invention relates to a semiconductor device, a method of manufacturing a semiconductor device, an SRAM device and a method of manufacturing an SRAM device having a sufficient process margin.

2. Description of the Related Art

Generally, semiconductor memory devices may be categorized as either a dynamic random access memory (DRAM) device or a static random access memory (SRAM) device in accordance with memory type. The SRAM device has a rapid speed, low power consumption, and a simply operated structure. Accordingly, the SRAM device is currently noticed in a semiconductor memory field. Information stored in the DRAM device is periodically refreshed. A periodical refresh of information stored in the SRAM device is, however, not necessary.

A typical SRAM device includes two pull-down elements, two pass elements, and two pull-up elements. The SRAM device may be classified as either a full CMOS type, a high load resistor (HLR) type, or a thin film transistor (TFT) type in accordance with the configuration of the pull-up element. A p-channel bulk MOSFET is used as the pull-up element in the full CMOS type. A polysilicon layer having a high resistance value is used as the pull-up element in the HLR type. A p-channel polysilicon TFT is used as the pull-up element in the TFT type. The SRAM device having the full CMOS type of a cell has a low standby current, and also stably operates compared to the SRAM having other types of cells. FIG. 1 is a circuit illustrating a conventional full CMOS type SRAM cell.

Referring to FIG. 1, a conventional SRAM cell includes first and second pass transistors Q1 and Q2 for electrically connecting first and second bit lines BL1 and BL2 to first and second memory cell nodes Nd1 and Nd2, respectively, a PMOS type pull-up transistor Q5 electrically connected between the first memory cell node Nd1 and a positive supply voltage Vdd, and an NMOS type pull-down transistor Q3 electrically connected between the first memory cell node Nd1 and a negative supply voltage Vss. The PMOS type pull-up transistor Q5 and the NMOS type pull-down transistor Q3 are controlled by a signal outputted from the second memory cell node Nd2 to thereby provide the positive supply voltage Vdd or the negative supply voltage Vss to the first memory cell node Nd1.

The conventional SRAM cell further includes a PMOS type pull-up transistor Q6 electrically connected between the positive supply voltage Vdd and the second memory cell node Nd2, and an NMOS type pull-down transistor Q4 electrically connected between the second memory node Nd2 and the negative supply voltage Vss. The PMOS type pull-up transistor Q6 and the NMOS type pull-down transistor Q4 are controlled by a signal outputted from the first memory cell node Nd1 to thereby provide the positive supply voltage Vdd or the negative supply voltage Vss to the second memory cell node Nd2.

The first pass transistor Q1, the NMOS type pull-down transistor Q3 and the PMOS pull-up transistor Q5 are interconnected at the first memory cell node Nd1. The second pass transistor Q2, the NMOS type pull-down transistor Q4 and the PMOS pull-up transistor Q6 are interconnected at the second memory cell node Nd2.

The full CMOS type SRAM cell includes the NMOS type transistors Q1, Q2, Q3 and Q4, and the PMOS type transistors Q5 and Q6. When the NMOS and PMOS type transistors are disposed adjacently to each other in one cell, a latch-up and the like may occur, which causes an excessive current to flow between a positive supply voltage line and a negative supply voltage line.

To prevent the occurrence of the latch-up, active patterns are disposed so that pitches between the active patterns can have more than two sizes. Namely, in such arrangement of the active patterns, a pitch between an active pattern in which the PMOS type transistor is formed and an active pattern in which the NMOS type transistor is formed is relatively lengthened to perform an entirely elemental isolation between the PMOS and NMOS transistors. On the contrary, a pitch between active patterns in which identical MOS type transistors are disposed is relatively shortened.

Thus, in the conventional full CMOS type SRAM cell, since the pitches between the active patterns have more than two sizes that are different from each other, pitches between patterns and pitches between contacts formed on the active pattern, respectively, are also more than two sizes. When the pitches between the patterns formed by the same process are varied as described above, a margin of a photolithography process for forming the patterns is determined based on the minimal one of the pitches between the patterns. Accordingly, the process margin is greatly decreased so that a probability of failures in forming the patterns may be high. Furthermore, it may be difficult to manufacture a highly-integrated semiconductor device by shrinking a cell size of the semiconductor device.

Embodiments of the invention address these and other disadvantages of the conventional art.

SUMMARY OF THE INVENTION

The present invention provides a semiconductor device having an increased margin of a photolithography process.

The present invention also provides a method of manufacturing a semiconductor device having an increased margin of a photolithography process.

The present invention still also provides an SRAM device having an increased margin of a photolithography process.

The present invention still also provides a method of manufacturing an SRAM device having an increased margin of a photolithography process.

BRIEF DESCRIPTION OF THE DRAWINGS

The above and other features and advantages of the invention will become readily apparent by reference to the following detailed description when considered in conjunction with the accompanying drawings.

DESCRIPTION OF THE PREFERRED EMBODIMENTS

Figure 1:
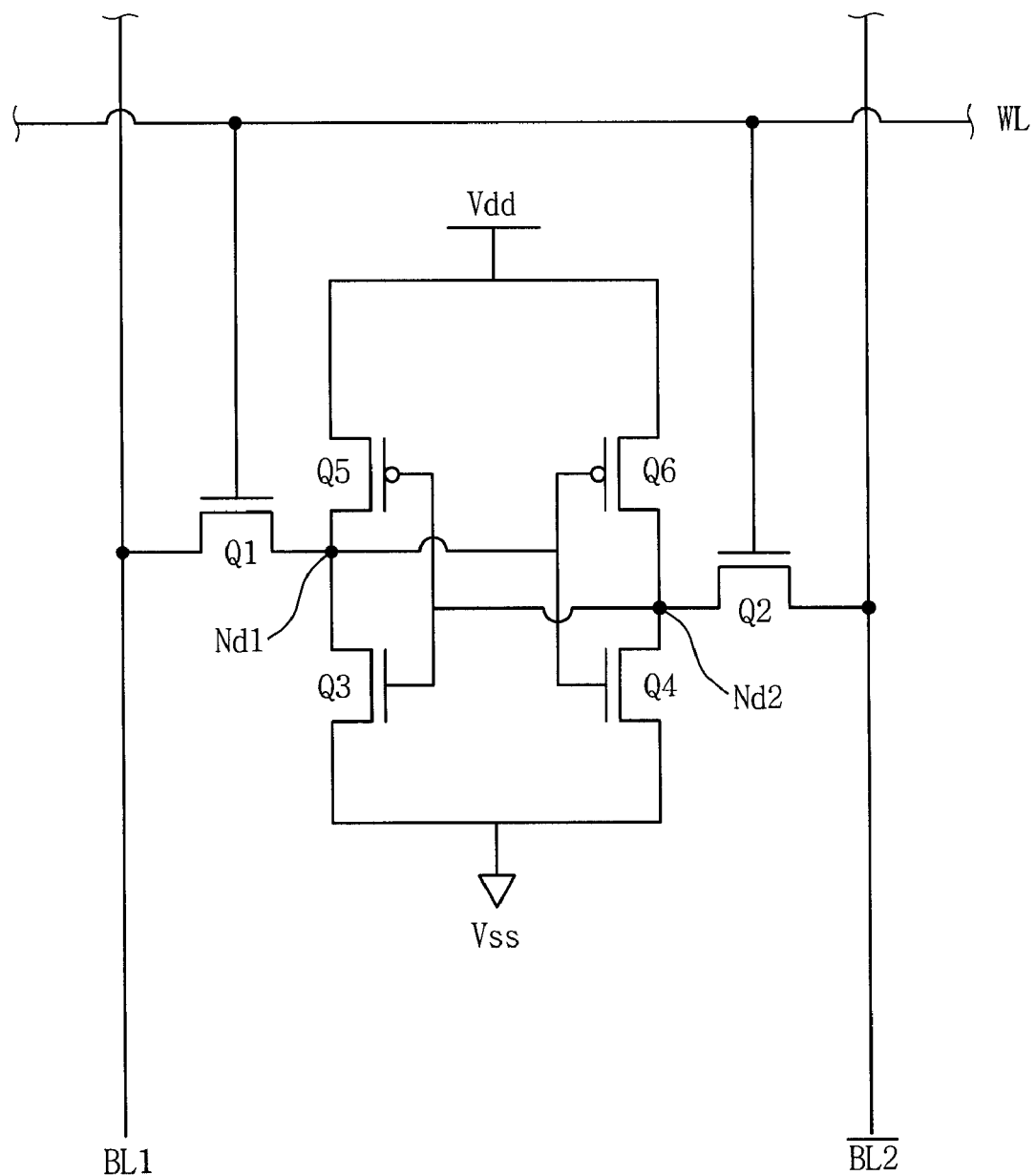
FIG. 1 is a circuit diagram illustrating a conventional full CMOS type SRAM cell.

The invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to similar or identical elements throughout. It will be understood that when an element such as a layer, region or substrate is referred to as being "on" or "onto" another element, it can be directly on the other element or intervening elements may also be present.

Hereinafter, a semiconductor device according to several embodiments of the invention will be described and illustrated in detail.

A semiconductor device generally includes a data input/output interface, a cell array on which memory cells are disposed, an address recorder, and a controller for controlling writing/reading of a data. A plurality of cells is formed in the cell array to form cell regions.

Each unit cell region includes a P type impurity region into which a P type impurity is implanted and an N type impurity region into which an N type impurity is implanted.

In the P type and N type impurity regions, active patterns including first and second patterns that have a first pitch are disposed. Here, the first pitch represents a distance between a first side of the first pattern and a first side of the second pattern adjacent to the first pattern.

On the active patterns, a number of gate patterns having a second pitch are disposed. The gate patterns are disposed in a direction substantially perpendicular to the active patterns. The first pitch may be substantially identical to the second pitch.

A first side of the cell region has a length substantially equal to an integral multiple of the first pitch. A second side of the cell region substantially perpendicular to the first side has a length substantially equal to an integral multiple of the second pitch. Here, the first side is substantially perpendicular to the active patterns. The second side is substantially parallel to the active patterns.

Hereinafter, a method of manufacturing a semiconductor device is illustrated in detail.

A cell region is disposed in a cell array of a substrate doped with a P type impurity. An N type impurity is implanted selectively into a first region of the cell region to form an N type impurity region. Accordingly, a second region of the cell region except for the first region is a P type impurity region.

Active patterns having a first pitch are formed in the N type and P type impurity regions. In particular, a first photoresist pattern having the first pitch is formed on the cell region so that the first photoresist pattern may cover an active region of the cell region. The substrate is etched using the photoresist pattern as an etching mask to form a trench. The trench is filled with a field oxide layer to form the active patterns and field patterns.

Gate patterns having a second pitch are formed in a direction perpendicular to and on the active patterns. Particularly, a gate oxide layer is formed on the active patterns of the substrate. A conductive layer is formed on the gate oxide layer. A second photoresist pattern having the second pitch is formed on the conductive layer. The conductive layer and the gate oxide layer are etched using the second photoresist pattern as an etching mask to form the gate patterns having the second pitch. Here, the first pitch may have substantially identical to the second pitch. On the contrary, the first pitch may be different from the second pitch.

After the active patterns are formed, the unit cell region of a semiconductor device is determined. A first side of the unit cell region has a length substantially equal to integer times of the first pitch. A second side of the unit cell region substantially perpendicular to the first side has a length substantially equal to integer times of the second pitch. Here, the first side is substantially perpendicular to the active patterns. The second side is substantially parallel to the active patterns.

Finally, a semiconductor device is manufactured by performing a doping process for forming source/drain regions, a process for forming an insulating interlayer, and a process for forming a contact, etc.

Figure 2:
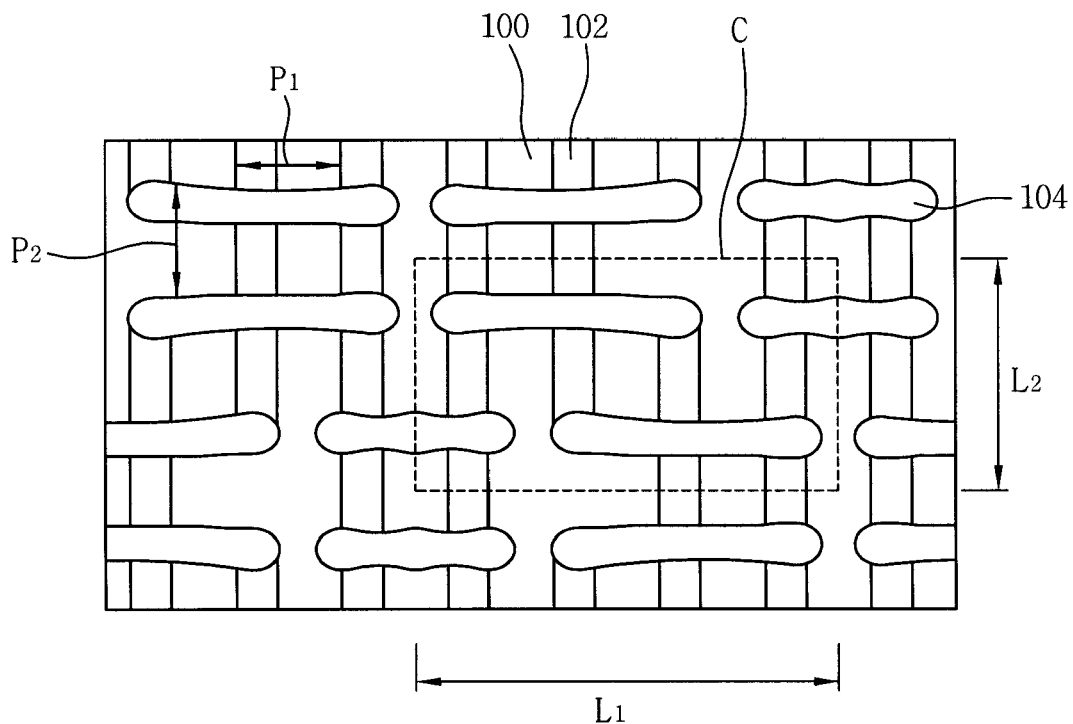
FIG. 2 is a layout diagram illustrating active patterns and gate patterns of a full CMOS type SRAM cell in accordance with some embodiments of the invention.

FIG. 2 is a layout diagram illustrating active patterns and gate patterns of a full CMOS type SRAM cell according to some embodiments of the invention.

An SRAM cell includes first and second pass transistors for electrically connecting first and second bit lines to first and second memory cell nodes, a PMOS type pull-up transistor electrically connected between the first memory cell node and a positive supply voltage, and an NMOS type pull-down transistor electrically connected between the first memory cell node and a negative supply voltage. The SRAM cell further includes another PMOS type pull-up transistor electrically connected between the positive supply voltage and the second memory cell node, and another NMOS type pull-down transistor electrically connected between the second memory node and the negative supply voltages.

That is, the full CMOS type SRAM cell includes both NMOS type transistors and PMOS type transistors. Accordingly, the active patterns are formed to provide the regions in which the PMOS type transistors and the NMOS type transistors are formed in the one SRAM cell.

Referring to FIG. 2, a plurality of chips are formed on a substrate. A cell array in which a unit cell is formed is provided in the chips. A region in which the single cell is formed is referred to as a unit cell region C.

A P type well corresponding to a well of the NMOS transistor is formed in the unit cell region C. A P type impurity is implanted into the P type well. An N type well corresponding to a well of the PMOS transistor is also formed in the cell region C. An N type impurity is implanted into the N type well.

Linear active patterns 102 are disposed at a distance of the same first pitch P1 from each other on the N type and P type wells. Here, the first pitch P1 indicates the shortest distance between a first side of a first linear active pattern and a first side of a second linear active pattern adjacent to the first linear active pattern.

Also, a plurality of gate patterns 104 are formed at a distance of the same second pitch P2 from each other on active patterns 102. The gate patterns 104 are disposed in a direction substantially perpendicular to the active patterns 102. The gate patterns 104 include a gate oxide layer (not shown) and a conductive layer (not shown) formed on the gate oxide layer. The gate patterns 104 are provided to function as gate electrodes of the PMOS and NMOS transistors.

Here, the first pitch P1 may have a size substantially identical to the second pitch P2. Alternatively, the first pitch P1 may be different from the second pitch P2.

A first side L1 of the cell region C has a length substantially equal to an integral multiple of the first pitch P1. A second side L2 of the cell region C substantially perpendicular to the first side L1 has a length substantially equal to an integral multiple of the second pitch P2. Here, the first side L1 is substantially perpendicular to the active patterns 102. The second side L2 is substantially parallel to the active patterns 102.

An insulating interlayer (not shown) is formed on the active patterns 102 and the gate patterns 104. Contacts (not shown) are formed through the insulating interlayer. The contacts include a bit line contact electrically connected to the bit lines, a pass gate contact formed on a surface of the gate patterns 104 of the first and second pass transistors, a positive supply voltage contact, and a negative supply voltage contact.

Additionally, although there are not shown in drawings, a word line is connected to the pass gate contact. A positive supply voltage line is connected to the positive supply voltage contact. Also, a negative supply voltage is connected to the negative supply voltage contact.

FIGS. 3A to 3D are layout diagrams illustrating a method of manufacturing a full CMOS type SRAM cell in accordance with the embodiments illustrated in FIG. 2.

Figure 3A:
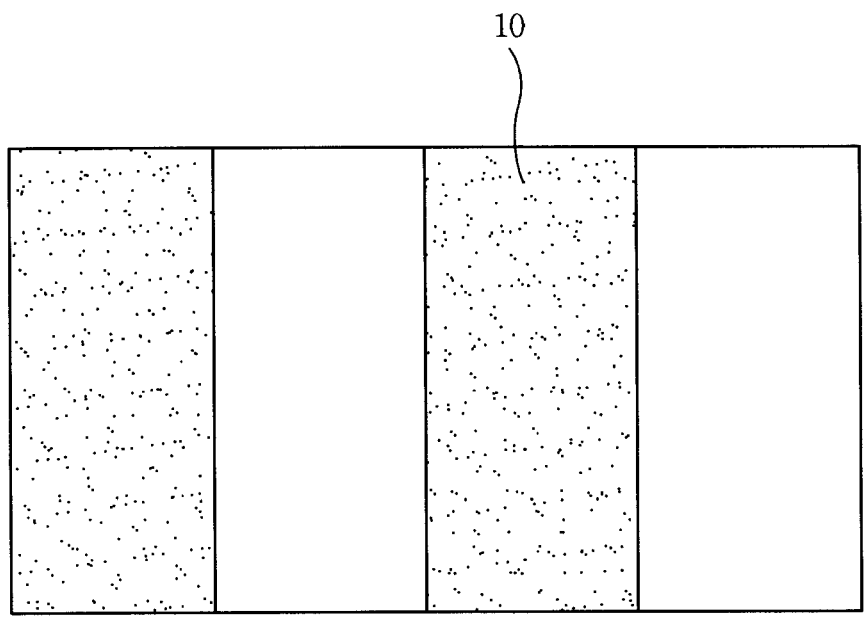
FIGS. 3A to 3D are layout diagrams illustrating a method of manufacturing a full CMOS type SRAM cell in accordance with the embodiments illustrated in FIG. 2.

Referring to FIG. 3A, a substrate doped with a P type impurity is provided. An N type impurity is implanted into regions within a cell array region of the substrate to form N type wells 10. The N-type wells 10 are used for forming PMOS transistors. Thus, the substrate is divided into N type wells 10 and P type wells.

Figure 3B:
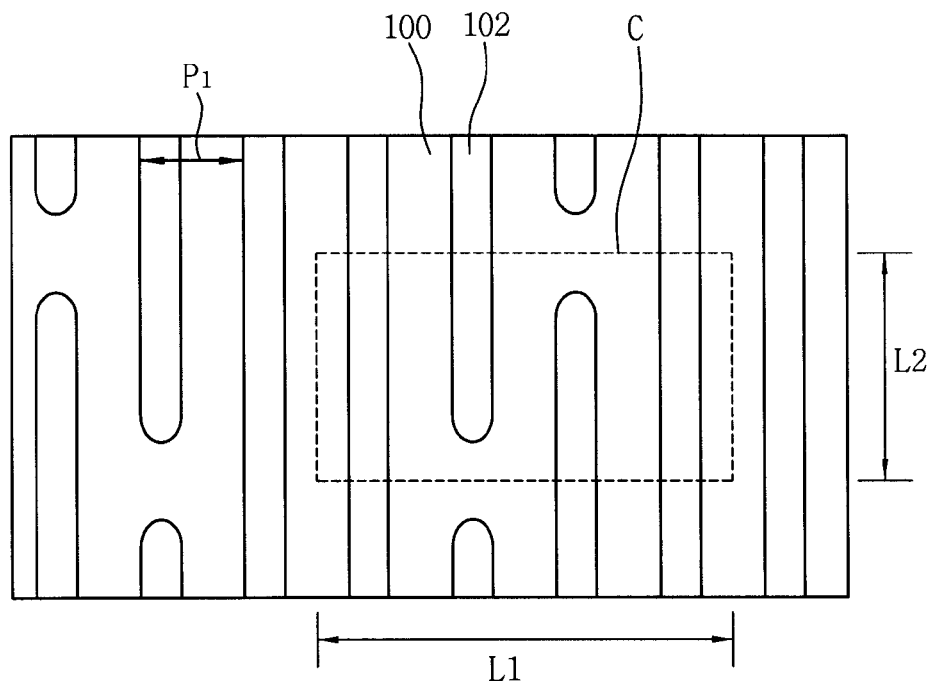
Figure 4:
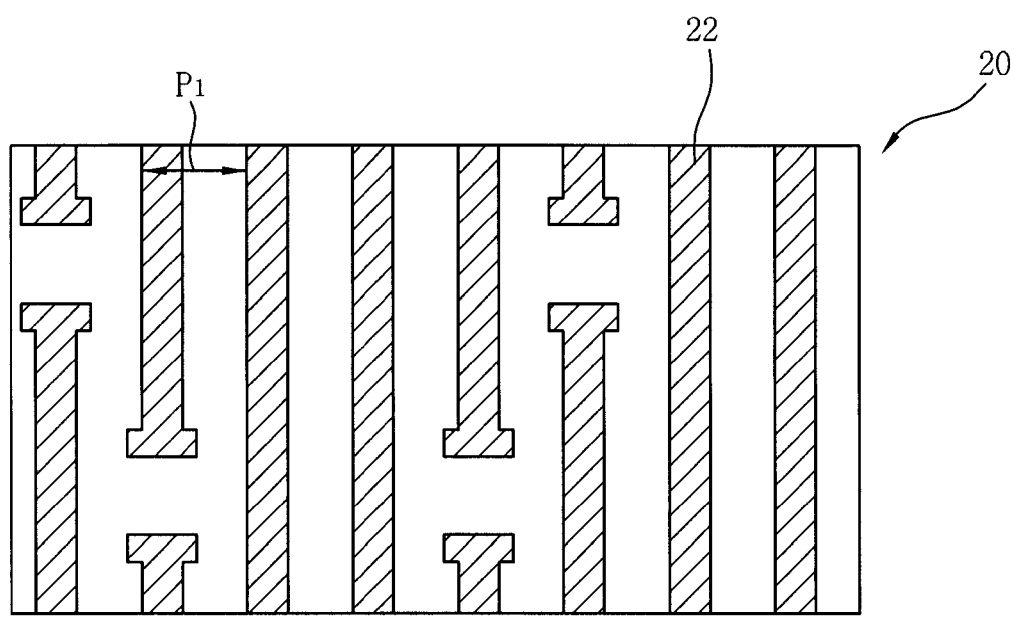
FIG. 4 is a plan view diagram illustrating a first exposure mask in accordance with the embodiments illustrated in FIG. 2.

Referring to FIG. 3B, a pad oxide layer (not shown) is formed on the substrate. A silicon nitride layer (not shown) is formed on the pad oxide layer. A photoresist layer (not shown) is formed on the silicon nitride layer. The photoresist layer is exposed and developed using a first exposure mask, which is illustrated in FIG. 4, to form a first photoresist pattern (not shown) having a first pitch P1. The first photoresist pattern is used for forming active patterns 102.

FIG. 4 is a plan view diagram illustrating the first exposure mask according to the embodiments illustrated in FIG. 2. With reference to FIG. 4, the first exposure mask 20 includes a plurality of first shield patterns 22 for blocking light. The first shield patterns 22 correspond to regions for forming an active pattern in the cell array. The pitches between the first shield patterns 22 are substantially identical to the first pitch P1. The first shield patterns 22 are disposed substantially parallel to each other.

The silicon nitride layer (not shown) is etched using the first photoresist pattern as an etching mask to form a silicon nitride layer pattern (not shown). The pad oxide layer and the substrate are etched using the silicon nitride layer pattern as a hard mask to form a trench (not shown) defining a field region in the substrate. The trench is filled with a silicon oxide layer (not shown). The silicon oxide layer is polished to expose the pad oxide layer.

The silicon nitride layer pattern and the pad oxide layer are removed to form field patterns 100 and active patterns 102. By the above-described process, the active patterns 102 having the first pitch P1 and substantially parallel to each other are formed.

The active patterns 102 define a unit cell region C. The cell region C has a first side and a second side substantially perpendicular to the first side. The first side is substantially perpendicular to the first pitch P1. The first side has a length L1 substantially equal to art integral multiple of the first pitch P1. The length L2 of the second side is shorter than the length L1 of the first side.

Figure 3C:
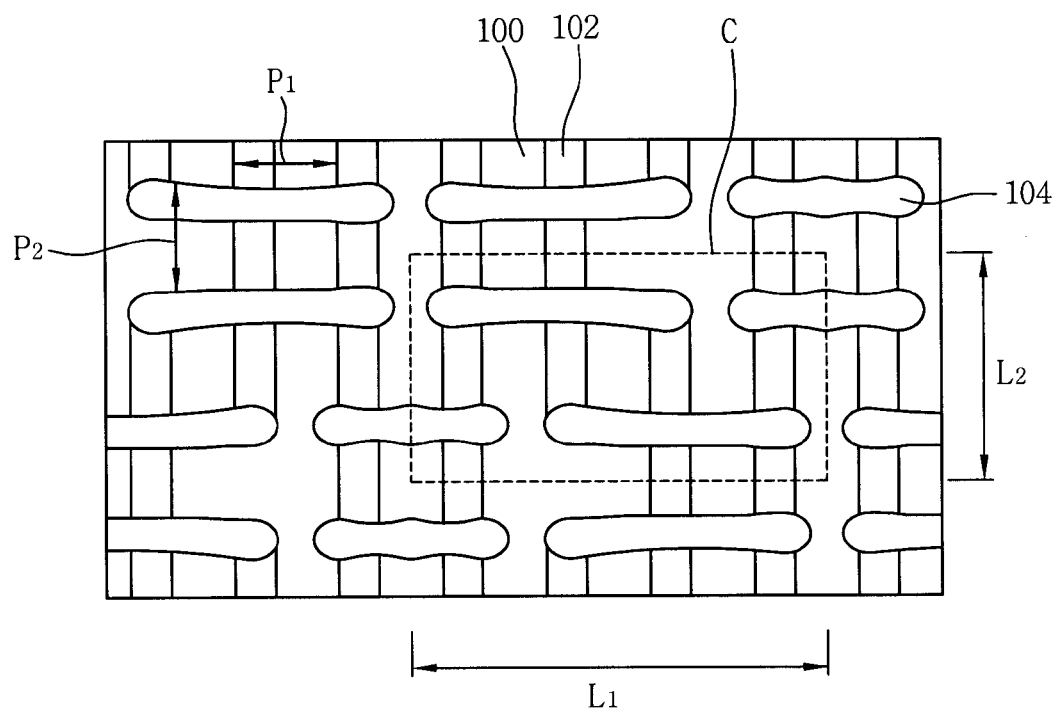

Referring to FIG. 3C, a gate oxide layer (not shown) having a thickness of about 30 Å to about 300 Å is formed on the substrate in which the linear active patterns 102 are formed. Successively, a polysilicon layer (not shown) is formed on the gate oxide layer. A metal silicide layer (not shown) is formed on the polysilicon layer.

Figure 5:
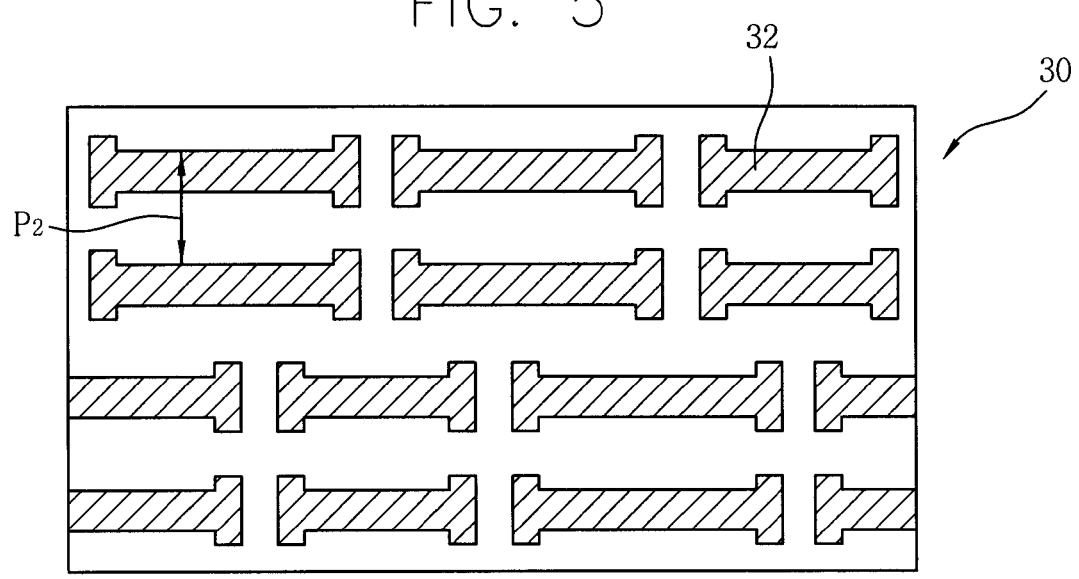
FIG. 5 is a plan view diagram illustrating a second exposure mask in accordance with the embodiments illustrated in FIG. 2.

Further, a photoresist layer (not shown) is formed on the metal silicide layer. The photoresist layer is exposed and developed using a second exposure mask, which is illustrated in FIG. 5, to form a second photoresist pattern (not shown) having a second pitch P2. The second photoresist pattern is used for forming a gate pattern.

FIG. 5 is a plan view diagram illustrating the second exposure mask according to the embodiments illustrated in FIG. 2. With reference to FIG. 5, the second exposure mask 30 includes a plurality of second shield patterns 32 for blocking light. The second shield patterns 32 correspond to regions for forming the gate patterns 104. The pitches between second shield patterns 32 are substantially identical to the second pitch P2. The shield patterns 32 are substantially perpendicular to the active patterns 102. Here, the second pitch P2 may be substantially identical to the first pitch P1. Alternatively, the second pitch P2 may be different from the first pitch P1.

Returning to FIG. 3C, the metal silicide layer, the polysilicon layer, and the gate oxide layer in turn are subsequently etched using the second photoresist pattern 30 as an etching mask to form the gate patterns 104. The gate patterns 104 having the second pitch P2 are disposed substantially perpendicular to the active patterns 102. The length L2 of the second side is substantially equal to an integral multiple of the second pitch P2. Here, the second side is substantially parallel to the active patterns 102.

Figure 3D:
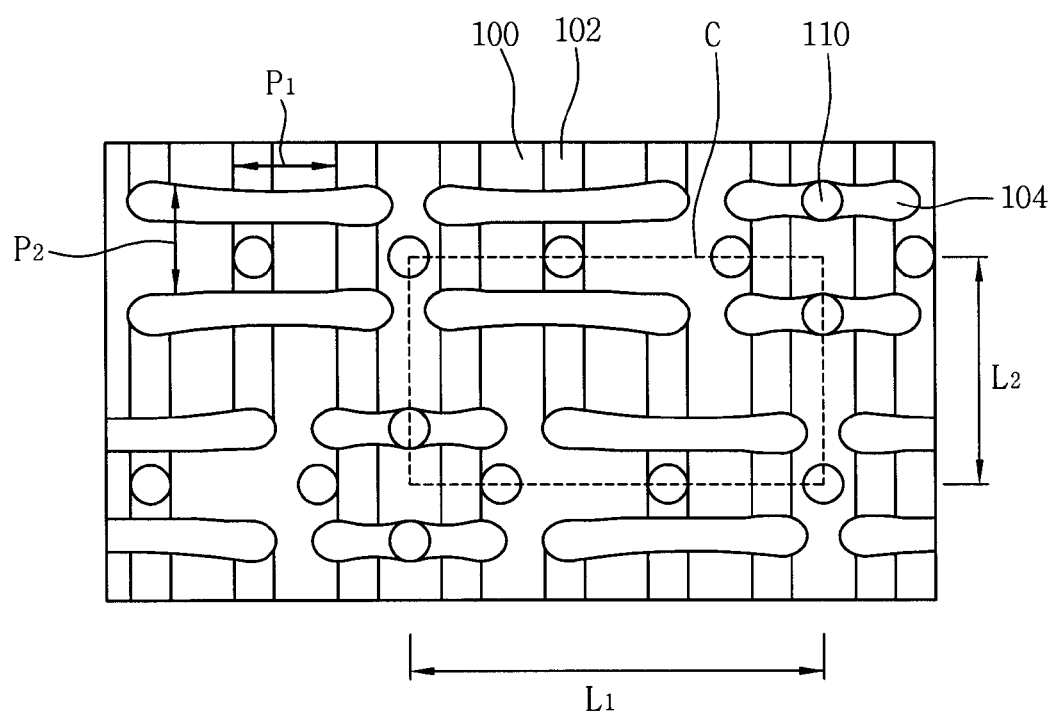

Referring to FIG. 3D, an insulating interlayer (not shown) is formed on the gate patterns 104. The insulating interlayer may include silicon oxide.

A photoresist layer (not shown) is formed on the insulating interlayer. The photoresist layer is exposed and developed using a third exposure mask, which is illustrated in FIG. 6, to form a third photoresist pattern (not shown) used for forming a contact hole.

Figure 6:
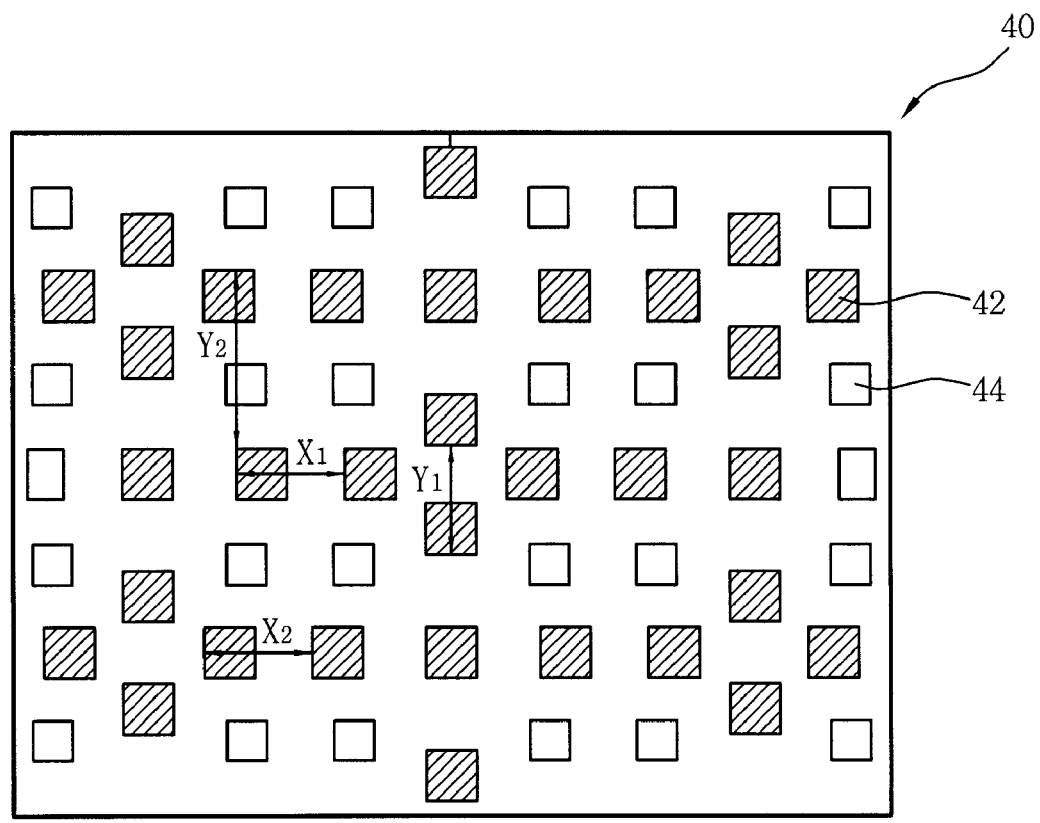
FIG. 6 is a plan view diagram illustrating a third exposure mask in accordance with the embodiments illustrated in FIG. 2.

FIG. 6 is a plan view diagram illustrating the third exposure mask 40 according to the embodiments illustrated in FIG. 2. With reference to FIG. 6, the third exposure mask 40 includes contact patterns 42 for exposing regions in which the contact holes are formed, and also includes dummy contact patterns 44 irregularly disposed between the contact patterns 42. Pitches between the contact patterns 42 in an X direction have a length substantially equal to an integral multiple of a minimum pitch between contact patterns 42 in the X direction. Pitches between the contact patterns 42 in a Y direction have a length substantially equal to an integral multiple of a minimum pitch between contact patterns 42 in the Y direction. For example, in FIG. 6, a pitch X1 is substantially identical to a pitch X2. A pitch Y2 is about two times larger than the pitch Y1.

Although light is irradiated through the dummy contact patterns 44 onto portions of the photoresist layer, the portions of the photoresist layer are not developed. Thus, the portions of the photoresist layer are not patterned. However, the dummy contact patterns 44 give a proximity effect to the contact patterns 42 adjacent to the dummy contact patterns 44 so that the third photoresist pattern has uniform openings.

The dummy contact patterns 44 are disposed in spaces between the contact patterns 42 that have a wide pitch. The pitches between the contact patterns 42 in the X and Y directions have a length substantially equal to an integral multiple of the minimum pitch in the corresponding direction, respectively. Thus, the dummy contact patterns 44 are interpositioned such that a pitch between the dummy contact pattern 44 and the contact pattern 42 is substantially similar to the minimum pitch between the contact patterns 42. Therefore, the entire patterns including the dummy contact patterns 44 and the contact patterns 42 are regularly disposed. As a result, exposure conditions in a space between the contact patterns 42 having a relatively narrow pitch and in a space between the contact patterns 42 having relatively wide pitch are similar so that the third photoresist pattern has the uniform openings.

Returning to FIG. 3D, the insulating interlayer is etched using the third photoresist pattern as an etching mask to form contact holes 110 that partially expose surfaces of the gate patterns 104 and the active patterns 102. The contact holes 110 include a bit line contact electrically connected to the bit lines, a pass gate contact formed on a surface of the gate patterns 104 of the first and second pass transistors, a positive supply voltage contact and a negative supply voltage contact.

Here, pitches between the contact holes 110 in an X direction have a length substantially equal to an integral multiple of a minimum pitch between the contact holes 110 in the X direction. Pitches between the contact holes 110 in a Y direction have a length substantially equal to an integral multiple of a minimum pitch between contact holes 110 in the Y direction.

The contact holes 110 are filled with a conductive layer therein. The conductive layer is planarized to form contacts. The contacts include bit lines, bit line contacts electrically connected to the bit lines, pass gate contacts formed on a surface of the gate patterns 104 of the first and second pass transistors, positive supply voltage contacts, and negative supply voltage contacts.

Additionally, a word line is connected to the pass gate contact. A positive supply voltage line is connected to the positive supply voltage contact. A negative supply voltage is connected to the negative supply voltage contact.

According to the above described embodiments for forming the SRAM cell, a margin of the processes increases.

FIGS. 7A to 7C, 8A to 8C and 9 show simulation results of forming photoresist patterns for an active region using conventional processes, which results in non-uniform pitches.

The exposure equipment used in this simulation had a numerical aperture of about 0.78 and an annular illuminator having a diameter of about 0.72 mm to 0.92 mm.

Figure 7A:
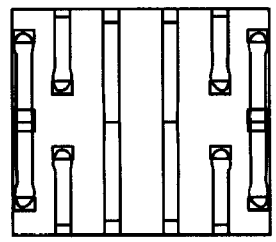
FIGS. 7A to 7C, 8A to 8C and 9 are plan views illustrating photoresist patterns manufactured in accordance with conventional processes and having non-uniform pitches.

The photoresist pattern in FIG. 7A was formed under conditions where a focus margin was about $0.0$ μm. The photoresist pattern in FIG. 7B was formed under conditions where the focus margin was about $0.1$ μm. The photoresist pattern in FIG. 7C was formed under conditions where the focus margin was about $0.2$ μm. As shown in FIG. 7C, even though the focus margin was about $0.2$ μm, the photoresist pattern was not normally formed.

Figure 7B:
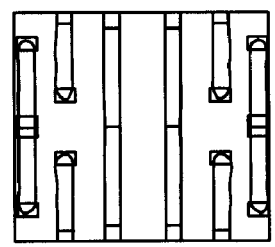
Figure 7C:
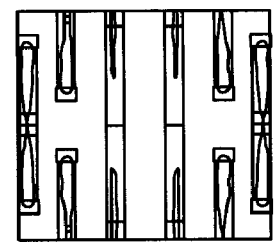
Figure 8A:
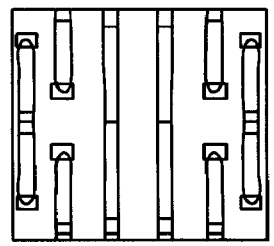
Figure 8B:
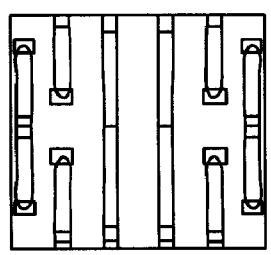
Figure 8C:
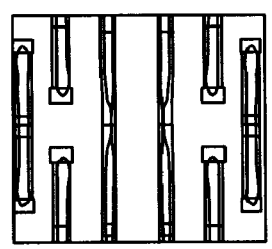

FIGS. 8A to 8C show photoresist patterns that were formed using exposure masks whose sizes were shrunk by about 80% from those of the exposure masks that were used for forming the photoresist patterns in FIGS. 7A to 7C.

The photoresist pattern in FIG. 8A was formed under conditions where a focus margin was about $0.0$ μm. The photoresist pattern in FIG. 8B was formed under conditions where the focus margin was about $0.1$ μm. The photoresist pattern in FIG. 8C was formed under conditions where the focus margin was about $0.2$ μm. As shown in FIG. 8C, even though the focus margin was about $0.2$ μm, the photoresist pattern was not normally formed.

Figure 9:
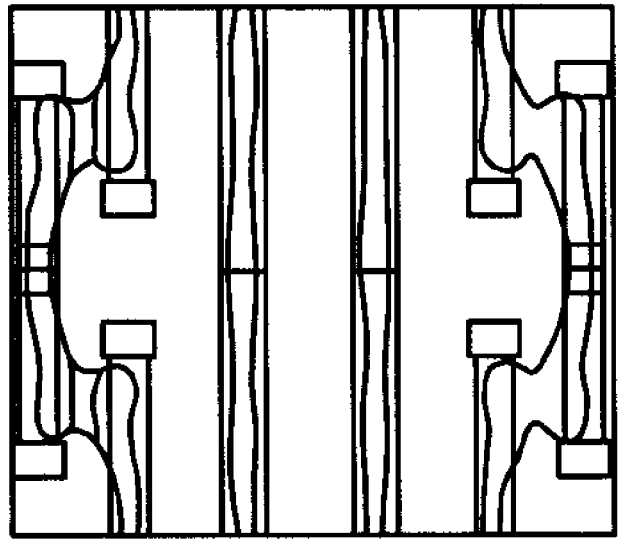

FIG. 9 shows an active photoresist pattern that was formed using an exposure mask whose size was shrunk by about 65% from that of the exposure mask that was used for forming the photoresist patterns in FIGS. 7A to 7C.

The photoresist pattern in FIG. 9 was formed under conditions where the focus margin was about $0.0$ μm. As shown in FIG. 9, even though the focus margin was about $0.0$ μm, the photoresist pattern was not normally formed.

From the above experimental results, it should be noted that, when the pitches are non-uniform, it is very difficult to normally form the photoresist pattern due to a low focus margin.

FIGS. 10A to 10C, 11A to 11C and 12A to 12C show simulation results of forming photoresist patterns for an active region, the photoresist patterns having uniform pitches in accordance with embodiments of the invention.

The exposure equipment used in this experiment had a numerical aperture of about 0.78 and an annular illuminator having a diameter of about 0.72 mm to 0.92 mm.

Figure 10A:
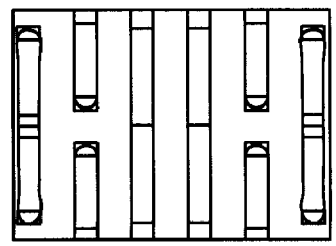
FIGS. 10A to 10C, 11A to 11C and 12A to 12C are plan views illustrating photoresist patterns having uniform pitches and manufactured in accordance with embodiments of the invention.

The photoresist pattern in FIG. 10A was formed under conditions where a focus margin was about $0.0$ μm. The photoresist pattern in FIG. 10B was formed under conditions where the focus margin was about $0.1$ μm. The photoresist pattern in FIG. 10C was formed under conditions where the focus margin was about $0.2$ μm. As shown in FIG. 10C, even though the focus margin was about $0.2$ μm, the photoresist pattern was normally formed.

Figure 10B:
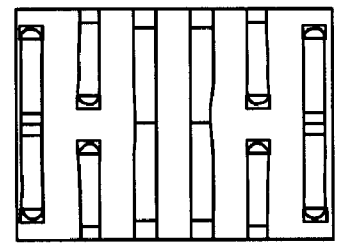
Figure 10C:
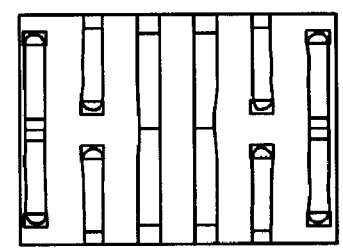
Figure 11A:
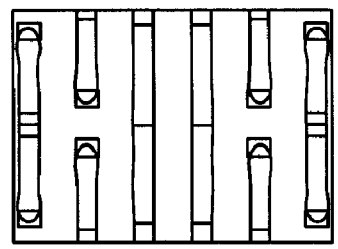
Figure 11B:
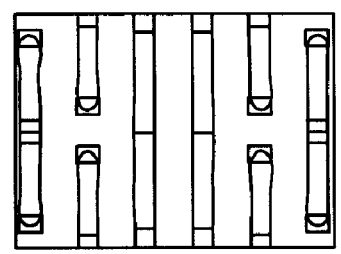
Figure 11C:
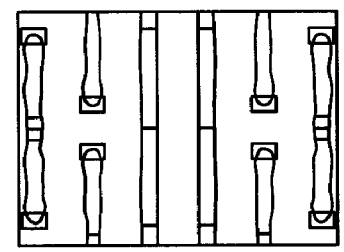

FIGS. 11A to 11C show photoresist patterns that were formed using an exposure mask whose sizes were shrunk by about 80% from those of the exposure masks that were used for forming the photoresist patterns in FIGS. 10A to 10C.

The photoresist pattern in FIG. 11A was formed under conditions where a focus margin was about $0.0$ μm. The photoresist pattern in FIG. 11B was formed under conditions where the focus margin was about $0.1$ μm. The photoresist pattern in FIG. 11C was formed under conditions where the focus margin was about 0.2 µm. As shown in FIG. 11C, even though the focus margin was about 0.2 µm, the photoresist pattern was normally formed.

Figure 12A:
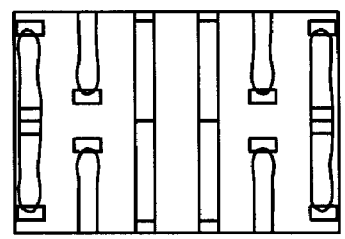
Figure 12B:
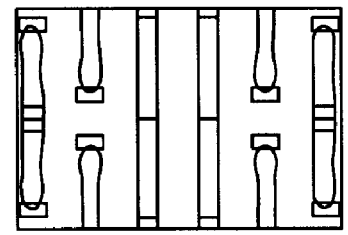
Figure 12C:
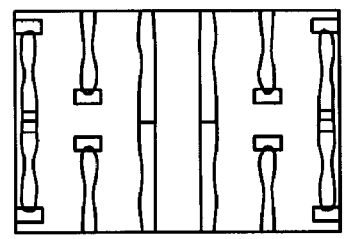

Also, FIGS. 12A to 12C show photoresist patterns that were formed using exposure masks whose sizes were shrunk by about 65% from those of the exposure masks that were used for forming the photoresist patterns in FIGS. 10A to 10C.

The photoresist pattern in FIG. 12B was formed under conditions where a focus margin was about 0.1 µm. As shown in FIG. 12B, even though the focus margin was about 0.1 µm, the photoresist pattern was normally formed.

From the above experimental results, it should be noted that, because the focus margin is increased when the pitches are uniform, it is easy to normally form the active photoresist pattern and the ability to shrink the resulting pattern is thereby increased.

Figure 13A:
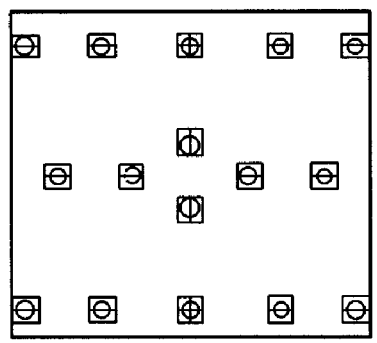
FIGS. 13A and 13B are plan views illustrating photoresist patterns for forming contacts, the photoresist patterns formed using a conventional exposure mask having non-uniform pitches.
Figure 13B:
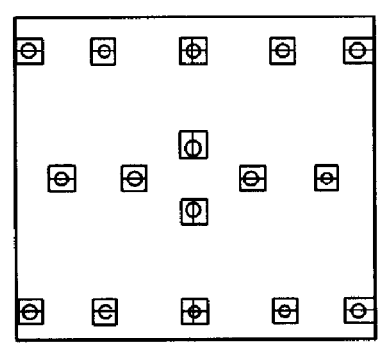

FIGS. 13A and 13B show simulation results of forming photoresist patterns for a contact, the photoresist patterns formed using a conventional exposure mask having non-uniform pitches.

In FIGS. 13A and 13B, squares represent contact patterns on an exposure mask, and circles represent photoresist patterns for contacts to be formed by an exposure process. The exposure equipment used in this simulation had a numerical aperture of about 0.78 and a conventional illuminator having a diameter of about 0.8 mm. The photoresist pattern in FIG. 13A was formed under conditions where a focus margin was about 0.0 µm. The photoresist pattern in FIG. 13B was formed under conditions where the focus margin was about 0.1 µm. Although this is not represented in drawings, when the focus margin was about 0.2 µm, the photoresist pattern might not be formed.

Figure 14A:
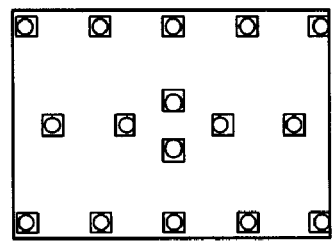
FIGS. 14A to 14C are plan views illustrating photoresist patterns for forming contact holes, the contact holes formed using an exposure mask having uniform pitches in accordance with embodiments of the invention.
Figure 14B:
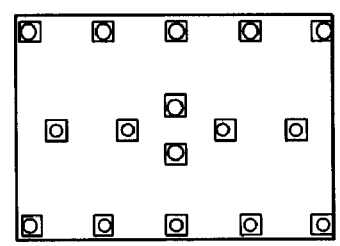
Figure 14C:
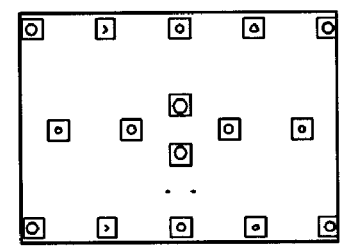

FIGS. 14A to 14C show simulation results of forming photoresist patterns for a contact hole, the photoresist patterns formed using an exposure mask having uniform pitches according to embodiments of the invention.

In FIGS. 14A to 14C, squares represent contact patterns on an exposure mask, and circles represent photoresist patterns for contacts to be formed by an exposure process. The exposure equipment used in this simulation had a numerical aperture of about 0.78 and a conventional illuminator having a diameter of about 0.8 mm.

The photoresist pattern in FIG. 14A was formed under conditions where a focus margin was about 0.0 µm. The photoresist pattern in FIG. 14B was formed under conditions where the focus margin was about 0.1 µm. The photoresist pattern in FIG. 14C was formed under conditions where the focus margin was about 0.2 µm. As shown in FIG. 14C, even though the focus margin was about 0.2 µm, the photoresist pattern was normally formed.

Figure 15A:
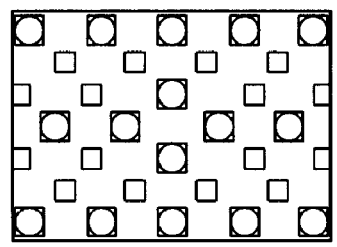
FIGS. 15A to 15C are plan views illustrating contact holes formed using an exposure mask into which a dummy pattern is inserted in accordance with embodiments of the invention.
Figure 15B:
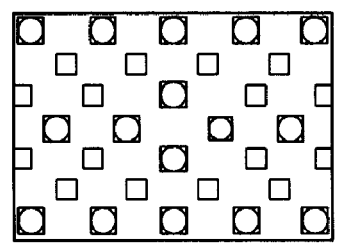
Figure 15C:
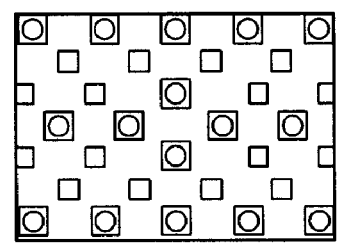

FIGS. 15A to 15C show simulation results of forming contact holes that were formed in accordance with embodiments of the invention, the contact holes formed using an exposure mask on which dummy pattern were interposed to form the uniform pitches between the contact patterns.

In FIGS. 15A to 15C, squares represent contact patterns on an exposure mask, and circles represent photoresist patterns for contacts to be formed by an exposure process. The exposure equipment used in this simulation had a numerical aperture of about 0.78 and a conventional illuminator having a diameter of about 0.8 mm.

The photoresist pattern in FIG. 15A was formed under conditions where a focus margin was about 0.0 µm. The photoresist pattern in FIG. 15B was formed under conditions where the focus margin was about 0.1 µm. The photoresist pattern in FIG. 15C was formed under conditions where the focus margin was about 0.2 µm. As shown in FIG. 15C, even though the focus margin was any one of 0.0 µm to 0.2 µm, the photoresist pattern for contacts was normally and uniformly formed.

Thus, according to embodiments of the invention, a semiconductor device having an increased margin of a photolithography process may be manufactured, and the resulting semiconductor device may be highly integrated by shrinking a cell size of the semiconductor device.

The invention may be practiced in many ways. What follows are exemplary, non-limiting descriptions of some embodiments of the invention.

A semiconductor device in accordance with some embodiments of the invention includes a P type impurity region and an N type impurity region provided on a substrate, active patterns, and gate patterns. The active patterns are disposed to have a first pitch from each other in the P type and N type impurity regions. The gate patterns are disposed in a direction substantially perpendicular to and on the active patterns to have a second pitch between them.

In a method of manufacturing a semiconductor device in accordance with other embodiments of the invention, a substrate doped with a P type impurity is provided. An N type impurity is doped into the substrate to divide the substrate into a P type impurity region and an N type impurity region. Active patterns having a first pitch are formed in the P type and N type impurity regions. Gate patterns having a second pitch are formed in a direction substantially perpendicular to the active patterns and on the active patterns.

An SRAM device in accordance with other embodiments of the invention includes an N type well and a P type well provided on a substrate. Active patterns having a first pitch are disposed in the N type and P type wells. Gate patterns having a second pitch are disposed in a direction substantially perpendicular to the active patterns and on the active patterns.

In a method of manufacturing an SRAM device in accordance with still other embodiments of the invention, a substrate doped with a P type impurity is provided. An N type impurity is doped into the substrate to divide the substrate into a P type well and an N type well. Active patterns having a first pitch are formed in the P type and N type wells. Gate patterns having a second pitch are formed in a direction substantially perpendicular to the active patterns and on the active patterns.

According to embodiments of the invention, a semiconductor device having an increased margin of a photolithography process may be formed. Because it is easy to shrink the cell size of such a semiconductor device, the semiconductor device may be highly integrated.

Furthermore, a failure rate in manufacturing the semiconductor device on the photolithography process is reduced so that the manufacturing yield of the semiconductor device may increase.

Having described preferred embodiments of the invention, it is noted that modifications and variations can be made by persons skilled in the art in light of the above teachings. It is therefore to be understood that changes may be made to the particular embodiments of the invention disclosed that are nevertheless still within the scope and the spirit of the invention as defined by the appended claims.

We claim:

1. A method of manufacturing a semiconductor device comprising:
   doping an N type impurity into a substrate doped with P type impurity to divide the substrate into a P type impurity region and an N type impurity region;
   first forming at least three active patterns in the P type and N type impurity regions, the at least three active patterns being parallel to one another and arranged in a first direction, the at least three active patterns extending longitudinally in a second direction, the second direction being perpendicular to the first direction; and second forming at least three gate patterns, each of the at least three gate patterns on at least one of the at least three active patterns, the at least three gate patterns being parallel to one another and arranged in the second direction, each of the at least three gate patterns extending longitudinally in the first direction, the at least, three gate patterns having a uniform first pitch between adjacent ones of the at least: three gate patterns in the second direction; and wherein the at least three active patterns have a uniform second pitch between adjacent ones of the at least three active patterns in the first direction.

2. A method of manufacturing an SRAM device comprising:

doping a substrate with a P type impurity:

doping an N type impurity into the substrate to divide the substrate into a P type well and an N type well;

first forming at least three active patterns in the P type and N type wells, the at least, three active patterns being parallel to one another and arranged in a first direction, the at least three active patterns extending longitudinally in a second direction, the second direction being perpendicular to the first direction; and second forming at least three gate patterns, each of the at least three gate patterns on at least one of the at least three active patterns, the at least three gate patterns being parallel to one another and arranged in the second direction, each of the at least three gate patterns extending longitudinally in the first direction, the at least three gate patterns having a uniform first pitch between adjacent ones of the at least three gate patterns in the second direction; and wherein the at least three active patterns have a uniform second pitch between adjacent ones of the at least three active patterns in the first direction.

3. A method of manufacturing an SRAM device comprising:

doping a substrate with a P type impurity;

doping an N type impurity into the substrate to divide the substrate into a P type well and an N type well;

first forming at least three active patterns in the P type and N type wells, the at least three active patterns being parallel to one another and arranged in a first direction, the at least three active patterns extending longitudinally in a second direction, the second direction being perpendicular to the first direction; and second forming at least three gate patterns, each of the at least three gate patterns on at least one of the at least three active patterns, the at least three gate patterns being parallel to one another and arranged in the second direction, each of the at least three gate patterns extending longitudinally in the first direction, the at least three gate patterns having a uniform first pitch between adjacent ones of the at least three gate patterns in the second direction;

forming an insulating interlayer on the active and gate patterns;

forming contact holes partially exposing surfaces of the active and gate patterns, the contact holes being disposed to have third pitches in an X direction and fourth pitches in a Y direction substantially perpendicular to the X direction, at least one of the third pitches being substantially identical to a minimum pitch among the third pitches, and at least one of the fourth pitches being about two times larger than a minimum pitch among the fourth pitches; and filling the contact holes with a conductive layer to form contacts, wherein the at least three active patterns have a uniform second pitch between adjacent ones of the at least three active patterns in the first direction.

4. The method of claim 1, wherein the first pitch is substantially the same as the second pitch.

5. The method of claim 4, wherein a unit cell region including the P type impurity region and the N type impurity region comprises a first side extending in the first direction and a second side extending in the second direction, and wherein the first side has a length substantially equal to an integral multiple of the first pitch.

6. The method of claim 5, wherein the second side has a length substantially equal to an integral multiple of the second pitch.

7. The method of claim 2, wherein the first pitch is substantially the same as the second pitch.

8. The method of claim 7, wherein a unit cell region including the P type impurity region and the N type impurity region comprises a first side extending in the first direction and a second side extending the second direction, and wherein the first side has a length substantially equal to an integral multiple of the first pitch.

9. The method of claim 8, wherein the second side has a length substantially equal to an integral multiple of the second pitch.

10. The method of claim 2, further comprising:

forming an insulating interlayer on the active and gate patterns;

etching the insulating interlayer to form contact holes partially exposing surfaces of the active and gate patterns, the contact holes being disposed to have pitches in an X direction and pitches in a Y direction substantially perpendicular to the X direction, the pitches in the X direction substantially equal to an integral multiple of a minimum pitch among the pitches in the X direction, and the pitches in the Y direction substantially equal to an integral multiple of a minimum pitch among the pitches in the Y direction; and filling the contact holes with a conductive layer to form contacts.

11. The method of claim 10, wherein forming the contact holes comprises:

forming a photoresist layer on the insulating interlayer;

exposing the photoresist layer using an exposure mask to form a photoresist pattern; and etching the insulating interlayer using the photoresist pattern as an etching mask.

12. The method of claim 11, wherein the exposure mask comprises contact patterns for forming the contacts and dummy contact patterns disposed between the contact patterns.

13. The method of claim 12, wherein the contact patterns and the dummy contact patterns are uniformly spaced apart from each other.

14. The method of claim 10, wherein at least one of, (i) one of the pitches in the X direction differs from another of the pitches in the X direction; and (ii) one of the pitches in the Y direction differs from another of the pitches in the Y direction.

15. The method of claim 3, wherein the first pitch is substantially the same as the second pitch.

16. The method of claim 3, wherein a unit cell region including the P type impurity region and the N type impurity region comprises a first side extending in the first direction and a second side extending the second direction, and wherein the first side has a length substantially equal to an integral multiple of the first pitch.

17. The method of claim 16, wherein the second side has a length substantially equal to an integral multiple of the second pitch.

18. The method of claim 3, wherein the forming the contact holes comprises:

forming a photoresist layer on the insulating interlayer;

exposing the photoresist layer using an exposure mask to form a photoresist pattern; and etching the insulating interlayer using the photoresist pattern as an etching mask.

19. The method of claim 18, wherein the exposure mask comprises contact patterns for forming the contacts and dummy contact patterns disposed between the contact patterns.

20. The method of claim 19, wherein the contact patterns and the dummy contact patterns are uniformly spaced apart from each other.

* * * * *